(12) United States Patent
Interrante et al.

(10) Patent No.: US 9,583,408 B1
(45) Date of Patent: Feb. 28, 2017

(54) REDUCING DIRECTIONAL STRESS IN AN ORTHOTROPIC ENCAPSULATION MEMBER OF AN ELECTRONIC PACKAGE

(71) Applicant: International Business Machines Corporation, Armonk, NY (US)

(72) Inventors: Marcus E. Interrante, New Paltz, NY (US); Yi Pan, The Woodlands, TX (US); Hilton T. Toy, Hopewell Junction, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/832,156

(22) Filed: Aug. 21, 2015

(51) Int. Cl.
| | |
|---|---|
| H01L 23/48 | (2006.01) |
| H01L 23/52 | (2006.01) |
| H01L 23/34 | (2006.01) |
| H01L 23/16 | (2006.01) |
| H01L 23/373 | (2006.01) |
| H01L 23/498 | (2006.01) |
| H01L 21/50 | (2006.01) |
| H01L 21/48 | (2006.01) |

(52) U.S. Cl.
CPC .......... H01L 23/16 (2013.01); H01L 21/4882 (2013.01); H01L 21/50 (2013.01); H01L 23/373 (2013.01); H01L 23/3737 (2013.01); H01L 23/498 (2013.01)

(58) Field of Classification Search
CPC .... H01L 23/373; H01L 23/16; H01L 23/3737
USPC .................................................. 257/690, 712
See application file for complete search history.

(56) References Cited

U.S. PATENT DOCUMENTS

| 6,407,922 | B1 | 6/2002 | Eckblad et al. | |
|---|---|---|---|---|
| 8,059,408 | B2 | 11/2011 | Lemak et al. | |
| 8,405,600 | B2 | 3/2013 | Reis et al. | |
| 8,542,488 | B2 | 9/2013 | Peterson et al. | |
| 2006/0011336 | A1* | 1/2006 | Frul ......................... | F28F 3/12 165/185 |
| 2007/0053168 | A1 | 3/2007 | Sayir et al. | |
| 2014/0284040 | A1 | 9/2014 | Colgan et al. | |

FOREIGN PATENT DOCUMENTS

EP        1754401        2/2007

\* cited by examiner

*Primary Examiner* — David S Blum
(74) *Attorney, Agent, or Firm* — Brandon C. Kennedy; Steven Meyers; Kennedy Lenart Spraggins LLP

(57) ABSTRACT

Methods and apparatuses for reducing directional stress in an orthotropic encapsulation member of an electronic package may include attaching a stiffening frame to a carrier, the stiffening frame comprising a central opening to accept a semiconductor chip and a plurality of opposing sidewalls, electronically coupling the semiconductor chip to the carrier concentrically arranged within the central opening, and thermally contacting a directional heat spreader to the semiconductor chip, the directional heat spreader transferring heat from the semiconductor chip, wherein the directional heat spreader is shaped to reduce a directional stress along the opposing bivector direction.

15 Claims, 8 Drawing Sheets

900

Attach a stiffening frame to a carrier, the stiffening frame comprising a central opening to accept a semiconductor chip, a base portion, and a plurality of opposing sidewalls
902

Electrically couple the semiconductor chip to the carrier concentrically arranged within the central opening
904

Thermally contact a directional heat spreader to the semiconductor chip, the directional heat spreader transferring heat from the semiconductor chip in an opposing bivector direction towards opposing sidewalls, wherein the directional heat spreader is shaped to reduce a directional stress along the opposing bivector direction
906

```
Electrically connect an IC chip module to a
motherboard, the IC chip module comprising:

a carrier comprising a top surface and a
bottom surface configured to be electrically
       connected to a motherboard;

a stiffening frame attached to the carrier top
  surface, the stiffening frame comprising a
central opening that accepts a semiconductor
    chip, a base portion, and a plurality of
              opposing sidewalls;

a semiconductor chip electrically connected to
  the carrier top surface and concentrically
   arranged within the central opening, and;

a directional heat spreader thermally
   contacting the semiconductor chip, the
   directional heat spreader transferring heat
 from the semiconductor chip in an opposing
 bivector direction towards opposing sidewalls,
  wherein the directional heat spreader is
 shaped to reduce a directional stress along
       the opposing bivector direction
                    1002
```

↓

```
Thermally contact a heat sink to the IC chip
                    module
                     1004
```

FIG. 8

REDUCING DIRECTIONAL STRESS IN AN ORTHOTROPIC ENCAPSULATION MEMBER OF AN ELECTRONIC PACKAGE

BACKGROUND

The present disclosure is generally related to electronic packaging, or, more specifically, methods, apparatus, and products for reducing directional stress in an orthotropic encapsulation member of an electronic package.

DESCRIPTION OF RELATED ART

As electronic packages continue to decrease in size, additional hurdles are discovered in the effective and efficient manufacturing and operation of electronic packages. For example, some current electronic packages use various conductive materials such as copper as a heat sink or heat transfer as a means of dissipating heat from an active semiconductor chip within the electronic package. In order to increase efficiencies in manufacturing, new materials and methods are sought out to replace traditional conductive materials. For example, certain types of graphite have been proposed for use in various parts of electronic packages, including as heat transfer structures. However, the use of these new materials presents new difficulties in manufacturing due to the particular nature of those materials.

SUMMARY

Methods and apparatuses for reducing directional stress in an orthotropic encapsulation member of an electronic package are disclosed. These may include attaching a stiffening frame to a carrier, the stiffening frame comprising a central opening to accept a semiconductor chip, a base portion, and a plurality of opposing sidewalls, electronically coupling the semiconductor chip to the carrier concentrically arranged within the central opening, and thermally contacting a directional heat spreader to the semiconductor chip, the directional heat spreader transferring heat from the semiconductor chip in an opposing bivector direction towards a first opposing sidewalls, wherein the directional heat spreader is shaped to reduce a directional stress along the opposing bivector direction.

The foregoing and other objects, features and advantages described herein will be apparent from the following more particular descriptions of example embodiments as illustrated in the accompanying drawings wherein like reference numbers generally represent like parts of example embodiments.

BRIEF DESCRIPTION OF THE DRAWINGS

FIG. 7 depicts a flow chart illustrating an example method for reducing directional stress in an orthotropic encapsulation member of an electronic package, in accordance with certain embodiments of the present disclosure.

FIG. 8 depicts a flow chart illustrating the usage of an electronic package within an electronic device, in accordance with certain embodiments of the present disclosure.

DETAILED DESCRIPTION OF EXAMPLE EMBODIMENTS

An embodiment of the present invention is related to an integrated circuit ("IC") chip module that includes a carrier, a stiffening frame, an IC chip (or "semiconductor chip"), and a directional heat spreader. The carrier has a top surface and a bottom surface configured to be electrically connected to a motherboard. The stiffening frame includes an opening that accepts the IC chip and may be attached to the top surface of the carrier. The IC chip is concentrically arranged within the opening of the stiffening frame. The directional heat spreader is attached to the stiffening frame and to the IC chip and generally removes heat in an opposing bivector direction. The directional heat spreader is shaped to reduce a directional stress along the opposing bivector direction.

Example methods, apparatus, and products for reducing directional stress in an orthotropic encapsulation member of an electronic package in accordance with certain embodiments described herein with reference to the accompanying drawings. FIGS. 1-5 illustrate the results of performing a set of example steps for forming an example IC chip module (200) configured to spread heat away from a semiconductor chip using an orthotropic material. Although the words "first," "second," third," etc., are used with reference to FIGS. 1-5 to aid in understanding, one of ordinary skill in the art would understand that such terms are not limiting and that more, fewer, and/or different steps may be used without departing from the scope of the present disclosure.

Figure 1:
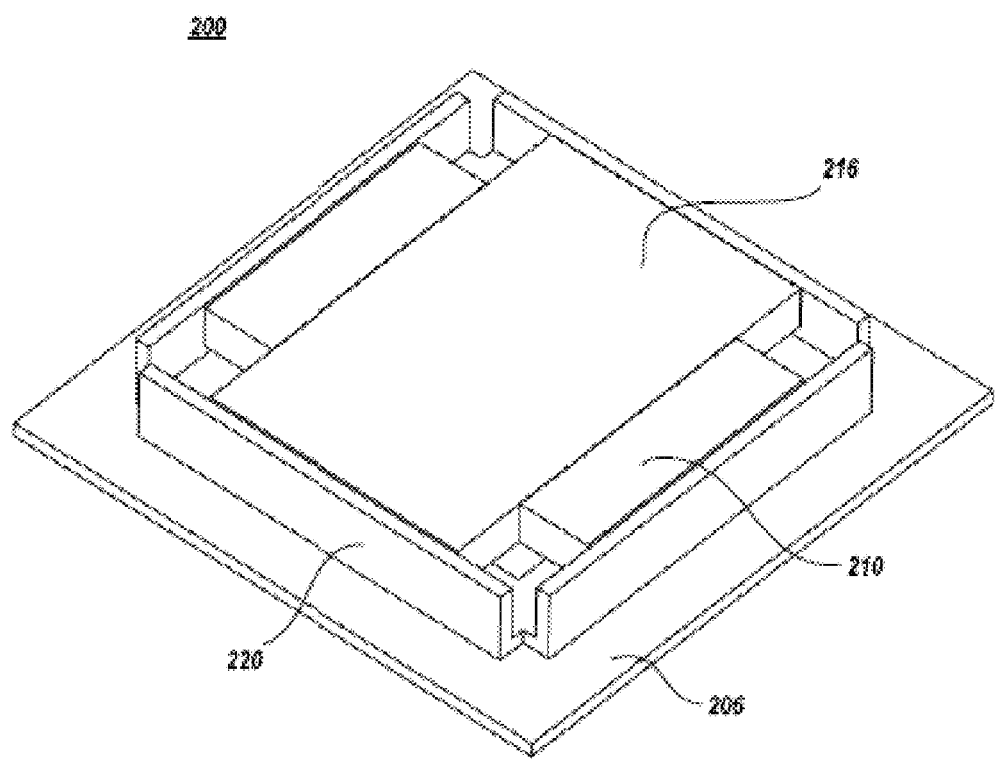
FIG. 1 illustrates an example IC chip module configured to spread heat away from a semiconductor chip using an orthotropic material, in accordance with certain embodiments of the present disclosure.

FIG. 1 illustrates an example IC chip module (200) configured to spread heat away from a semiconductor chip using an orthotropic material, in accordance with certain embodiments of the present disclosure. In some embodiments, the IC chip module (200) may include a carrier (206), a stiffening frame (220), a semiconductor chip, and one or more directional heat spreaders. The IC chip module (200) illustrated in FIG. 1 includes a first directional heat spreader (210) and a second directional heat spreader (216). However, in alternative embodiments, one, more, and/or different directional heat spreaders may be present within a given configuration or orientation without departing from the scope of the present disclosure.

Figure 2:
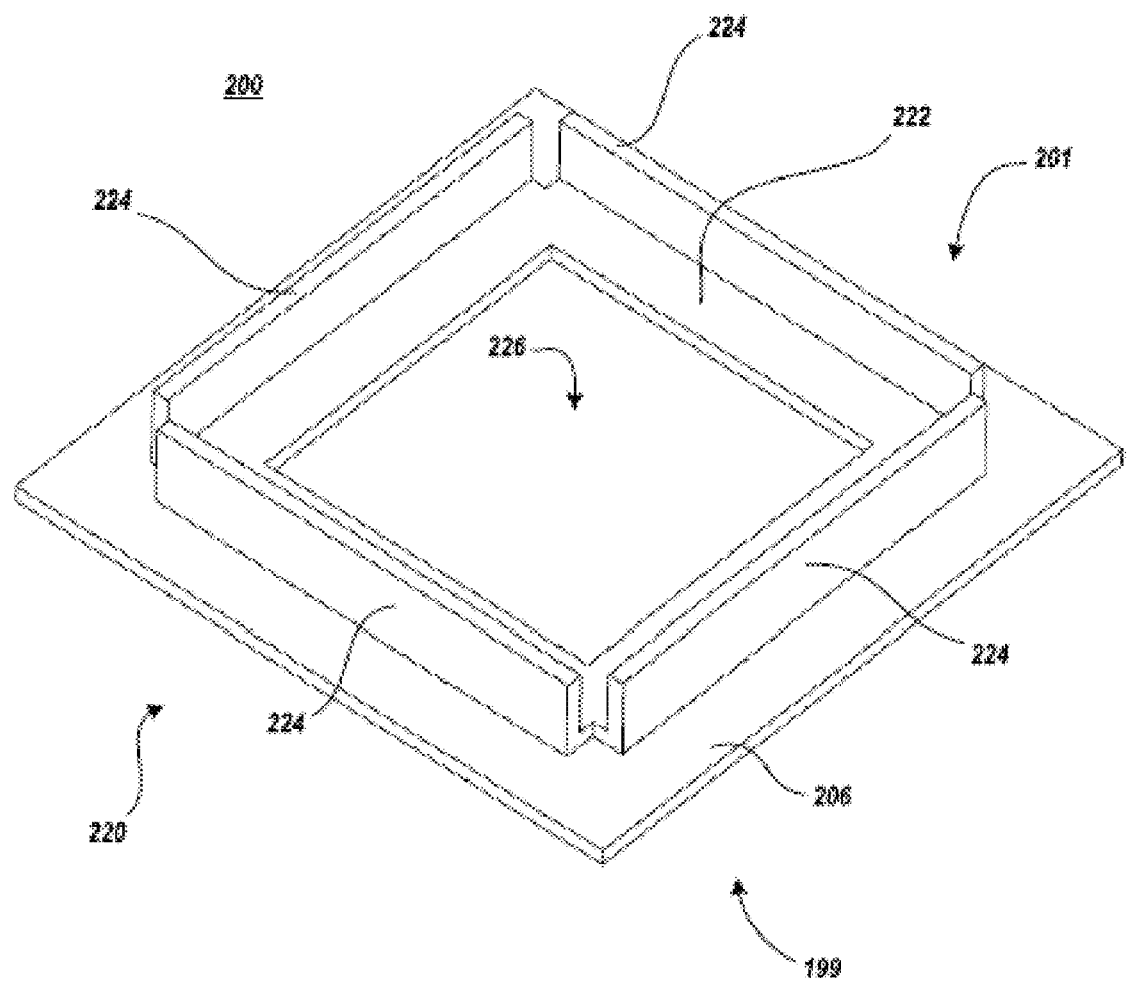
FIG. 2 illustrates a first step in forming example IC chip module, in accordance with certain embodiments of the present disclosure.

FIG. 2 illustrates a first step in forming an example IC chip module (200), in accordance with certain embodiments of the present disclosure. The IC chip module (200) depicted in FIG. 2 includes a carrier (206) that is coupled to a stiffening frame (220). The carrier (206) may be composed of organic materials. In some embodiments, the carrier (206) may include multiple layers of metallization and dielectric materials. Depending upon the configuration of layers, the carrier (206) may be a coreless, thin core, or standard core design. The dielectric materials may be, for example, epoxy resin with or without fiberglass fill. In various embodiments, the carrier (206) may interconnect with other devices such as a socket (pin grid array, land grid array, ball grid array, and the like).

The carrier (206) depicted in FIG. 2 includes a stiffening frame (220) that is coupled to the carrier (206) using a high strength adhesive, such as an epoxy, and the like. The stiffening frame (220) improves the flatness of the carrier (206), and in particular improves the flatness of an underside (199) of the carrier (206). The stiffening frame (220) may also improve the flatness of a topside (201) of the carrier (206). The flatness of carrier (206) at least partially allows for more efficient assembly or installation of the IC chip module (200) at a next level of assembly (e.g. motherboard, heat sink, and the like). The stiffening frame (220) provides mechanical support for the carrier (206) and may be particular advantageous in those applications where the carrier (206) is relatively thin (e.g. coreless, thin core, and the like). The stiffening frame (220) may be made utilizing materials with a desirable mechanical strength (e.g. copper, nickel, stainless steel, titanium, aluminum, molded plastics, ceramics, composites or combinations of each, and the like). The stiffening frame (220) may be made utilizing materials with a desirable coefficient of thermal expansion ('CTE') (e.g. similar CTE as carrier (206), and the like). The stiffening frame (220) may be made by forging, plating, stamping, molding, casting, machining, and the like. For example, the stiffening frame (220) may be made from stainless steel sheet metal.

The stiffening frame (220) can also include a central opening (226). In certain embodiments, the stiffening frame (220) may be configured so that the opening (226) is generally arranged so as to be substantially concentric with one or more IC chips, as described in more detail below with reference to FIG. 3. The stiffening frame (220) can also include a base portion (222) and may further include one or more sets of opposing sidewalls (224). An underside (199) of the base portion (222) may be attached to the carrier (206). Sidewalls (224), if employed, can extend upward from a topside (201) of the base portion (222) and provide additional stiffening to in-plane bending of the overall assembly. In certain embodiments, the stiffening frame (220) can include two sidewalls (224), four sidewalls (224), and the like. The sidewall (224) topside (201) surfaces may be substantially coplanar. In some embodiments, opposing or opposite facing sidewall (224) topside (201) surfaces are substantially coplanar.

Figure 3:
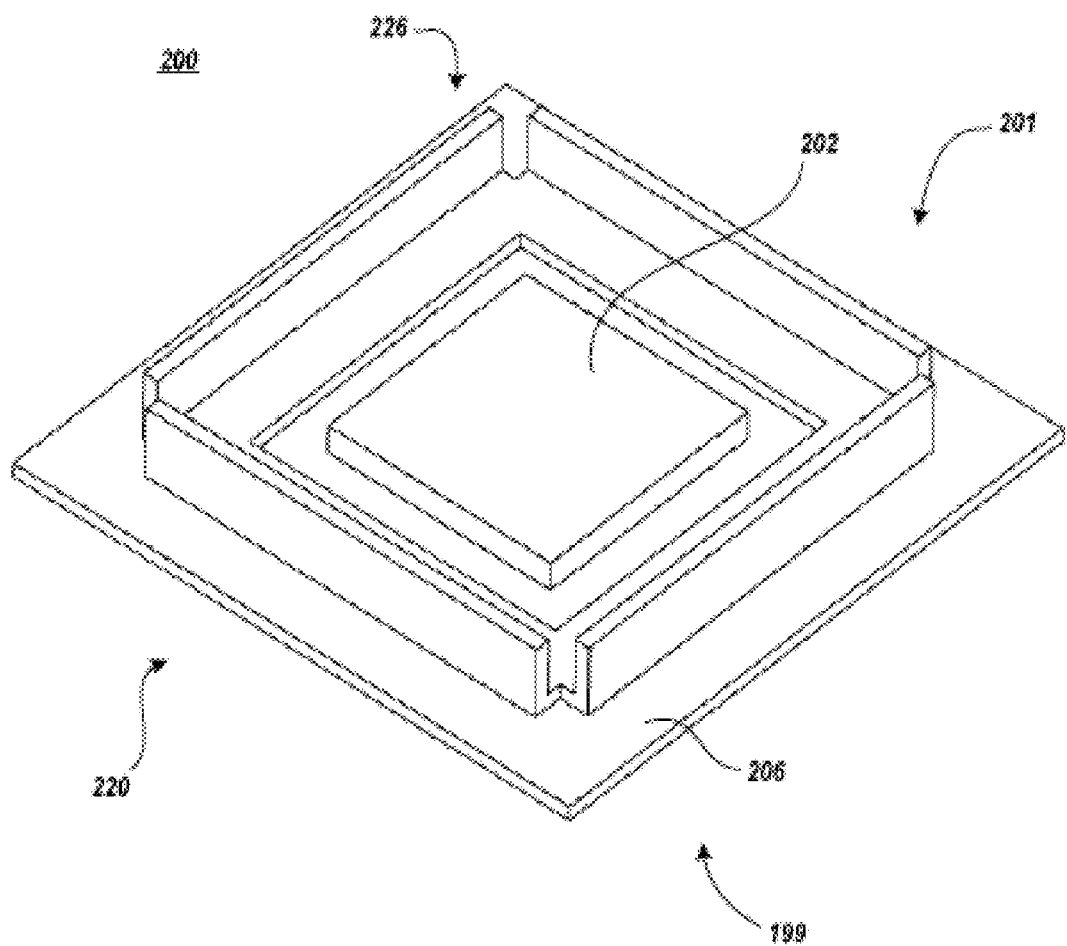
FIG. 3 illustrates a second step in forming example IC chip module, in accordance with certain embodiments of the present disclosure.

FIG. 3 illustrates a second step in forming example IC chip module (200), in accordance with certain embodiments of the present disclosure. IC chip module (200) includes a semiconductor chip (202). The semiconductor chip (202) may be an integrated circuit chip, semiconductor die, processor, microchip, and the like. Interconnects electrically connect the semiconductor chip (202) and the topside (201) of the carrier (206). Such interconnects can include a wire bond, solder bond, stud, conductive ball, conductive button, and the like. An underfill may be electrically-insulating, may substantially surround the interconnects, may isolate individual interconnects, and may provide mechanical support between the semiconductor chip (202) and the carrier (206). Underfill may also prevent damage to individual interconnects due to thermal expansion mismatches between the semiconductor chip (202) and the carrier (206).

In some embodiments, the carrier (206) may include other devices besides the semiconductor chip (202), for example, surface mount devices (e.g. capacitors, resistors, and the like). The semiconductor chip (202) may be for example a die, a microchip, a microprocessor, a graphic processor, a combined processor and graphics processor, an application specific integrated circuit ('ASIC'), a system on a chip ('SOC'), a three dimensional integrated circuit, a system on insulator ('SOI'), and the like.

Figure 4:
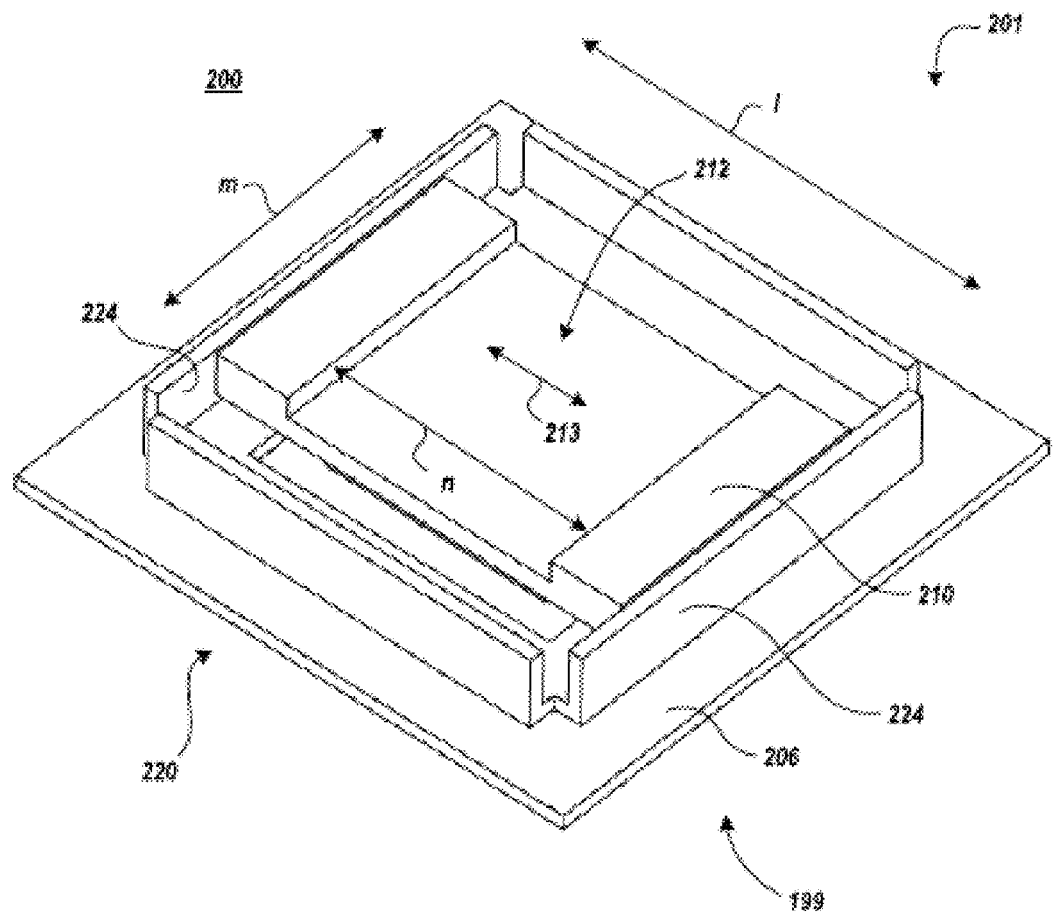
FIG. 4 illustrates a third step in forming example IC chip module, in accordance with certain embodiments of the present disclosure.

FIG. 4 illustrates a third step in forming an example IC chip module (200), in accordance with certain embodiments of the present disclosure. In some embodiments, the IC chip module (200) can include a first directional heat spreader (210). The first directional heat spreader (210) generally transfers heat relatively efficiently in a first opposing bivector direction (213) as well as through its thickness. An opposing bivector direction (213) consists of two opposing vectors (e.g., 180-degrees relative to each other). First directional heat spreader (210) may be made from a directionally thermally conductive material such as graphite. For example, the first directional heat spreader (210) may be fabricated from Pyroid® HT manufactured by MINTEQ® Pyrogenics Group. The first directional heat spreader (210) may have a higher coefficient of thermal conductivity as compared to copper in a first opposing bivector direction (213), resulting in the desirability of its use in future generations of electronic devices.

The first directional heat spreader (210) may thermally contact the one or more semiconductor chip(s) (202), such that efficient heat transfer between elements is achieved by the reduction of air gaps there between. As described in more detail below, the shape of the first directional heat spreader (210) may be altered so as to reduce directional stress on the first directional heat spreader (210). Furthermore, as described in more detail below, the shape of the first directional heat spreader (210) may be altered so as to improve the heat transfer between the first directional heat spreader (210) and the semiconductor chip (202).

In some embodiments, a thermal interface material ("TIM") may be applied to the top side (201) of the semiconductor chip (202) and a first directional heat spreader (210) may be applied to the top side (201) of the semiconductor chip (202) contacting the TIM. The TIM may be a thermal grease, gel, and so on. For example, the underside (199) of the first directional heat spreader (210) thermally contacts the topside (201) of the semiconductor chip (202) through the TIM.

When attached to the semiconductor chip (202), the first directional heat spreader (210) may contact the stiffener base portion (222) and/or the opposing sidewalls (224) of the stiffener (220). As such, the length of the first directional heat spreader (210) is approximately equal to the distance between the opposing sidewalls (224). The first directional heat spreader (210) may be press fit, interference fit, and the like, to the opposing sidewalls of stiffener (220). The first directional heat spreader (210) may also be attached via an adhesive, a silicone, and the like, to the base portion (222) and/or the opposing sidewalls (224) of the stiffener (220). For example, the underside (199) of the first directional heat spreader (210) may be adhered to the topside (201) of the stiffener base portion (222) using a silicone-based adhesive.

In some embodiments, the first directional heat spreader (210) may instead be loosely coupled to the stiffener (220) at an area of stiffening frame proximal to the opposing sidewalls (224). That is, the first directional heat spreader may be coupled to the stiffener (220) in a relatively loose, mechanical coupling. This may allow for some flexibility of movement within the first directional heat spreader (210). As described in more detail above, the shape of semiconductor chip (202) underlying the first directional heat spread (210) may result in a fulcrum underneath the first directional heat spreader (210), exacerbating limitations in the mechanical stress properties of the first directional heat spreader (210). By loosely coupling the first directional heat spreader (210) to the stiffener (220) away from the underlying fulcrum, some of this stress may be alleviated. In the same or alternative embodiments, the first directional heat spreader (210) may be loosely coupled to the opposing sidewalls (224) rather than to the stiffener (220) for analogous reasons. As an example of the relatively loose coupling, the first directional heat spreader (210) may be coupled to the stiffener (220) with a relatively low-strength bonding material such as the EA6700 silicone adhesive offered by Dow Corning®, at a thickness of approximately 140 µm.

The first directional heat spreader (210) may be fabricated such that the opposing bivector direction (213) may generally point to the opposing sidewalls (224) of the stiffener (220). In an embodiment, when attached to the semiconductor chip (202), a topside (201) surface of the first directional heat spreader (210) may be substantially coplanar with the topside (201) surface of the stiffening frame (220). In alternative embodiments, when attached to the semiconductor chip (202), a topside (201) surface of the first directional heat spreader (210) may be raised relative to the topside (201) surface of the stiffening frame (220).

In some embodiments, the first directional heat spreader (210) may include a topside (201) recess (212). The recess (212) may be to a depth approximately equal to half the overall height of the first directional heat spreader (210). A top side (201) of the recess (212) may generally be below the top side (201) of the first directional heat spreader (210). A dimension "m" of first directional heat spreader (210) may be equal to a dimension "n" of recess (212). The recess (212) may be centered upon a dimension "l" of the first directional heat spreader (210). Contacting the stiffening frame (220) and being in thermal contact with the semiconductor chip (202), the first directional heat spreader (210) may transfer heat from the semiconductor chip (202) to the opposing sidewalls (224) of the stiffener (220) along the bivector direction (213).

Figure 5:
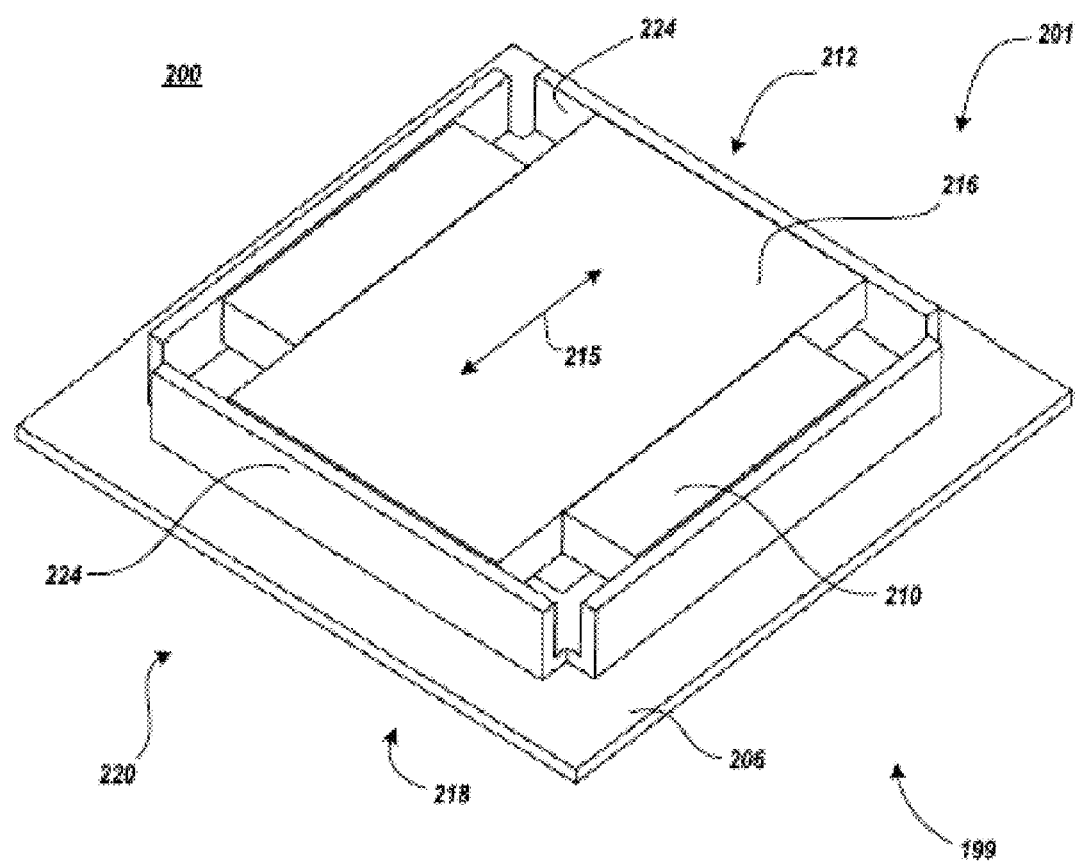
FIG. 5 illustrates a fourth step in forming example IC chip module, in accordance with certain embodiments of the present disclosure.

FIG. 5 illustrates a fourth step in forming an example IC chip module (200), in accordance with certain embodiments of the present disclosure. In some embodiments, the IC chip module (200) may include a second directional heat spreader (216). The second directional heat spreader (216) generally transfers heat efficiently in a second opposing bivector direction (215) as well as through its thickness. The opposing bivector direction (215) consists of two opposing vectors (i.e. 180 degrees relative to each other). The opposing bivector direction (215) may be orthogonal to the opposing bivector direction (213). The second directional heat spreader (216) may be made from a directionally thermally conductive material such as graphite. In a certain embodiment, the first directional heat spreader (216) may be fabricated from Pyroid® HT manufactured by MINTEQ® Pyrogenics Group. The second directional heat spreader (216) may have a higher coefficient of thermal conductivity as compared to copper in a second opposing bivector direction (215).

The second directional heat spreader (216) may thermally contact the first directional heat spreader (210). A thermal interface material ("TIM") may be applied to the top side (201) of the recess (212) and the second directional heat spreader (216) may be applied to the top side (201) of the recess (212) contacting the TIM. The TIM may be a thermal grease, gel, and so on. For example, an underside (199) of the second directional heat spreader (216) may thermally contact the topside (201) of the recess (212). More specifically, an underside (199) of a recess (218) of the second directional heat spreader (216) may thermally contact the topside (201) of the recess (212).

When attached to the first directional heat spreader (210), the second directional heat spreader (216) may contact the stiffener base portion (222) and/or opposing sidewalls (224) of the stiffener (220). As such, the length of the second directional heat spreader (216) is approximately equal to the distance between the opposing sidewalls (224). The second directional heat spreader (216) may be press fit, interference fit, and the like, to the opposing sidewalls of the stiffener (220). The second directional heat spreader (216) may also be attached via adhesive, silicone, and the like, to the base portion (222) and/or opposing sidewalls (224) of the stiffener (220). For example, the underside (199) of the second directional heat spreader (216) may thermally contact the topside (201) of the base portion (222).

The second directional heat spreader (216) may be fabricated such that the opposing bivector direction (215) may generally point to the opposing sidewalls (224) of the stiffener (220). In some embodiments, when attached to the first directional heat spreader (210), the topside (201) surface of the second directional heat spreader (216) may be substantially coplanar with the topside (201) surface of the stiffening frame (220) and the topside (201) surface of the first directional heat spreader (210). In alternative embodiments, when attached to the first directional heat spreader (210), the topside (201) surface of the second directional heat spreader (216) may be raised relative to the topside (201) surface of the stiffening frame (220) and may be substantially coplanar with the topside (201) surface of the first directional heat spreader (210).

The second directional heat spreader (216) may include an underside (199) recess (218). The recess (218) may be to a depth approximately equal to half the overall height of the second directional heat spreader (216). An underside (199) recess (218) is generally above the underside (199) of the second directional heat spreader (216). A dimension "p" of the second directional heat spreader (216) may be equal to a dimension "q" of recess (218). The recess (218) may be centered upon a dimension "o" of the second directional heat spreader (216).

Dimension "n" may be approximately equal to dimension "q" and dimension "p" may equal dimension "m" such that the second directional heat spreader (216) may juxtapose fit with the first directional heat spreader (212) via the fitting, linking, slotting, dovetailing, and the like, of recess (218) and recess (212), respectively. The second directional heat spreader (216) may be press fit, interference fit, adhered and the like, to the first directional heat spreader (210). The second directional heat spreader (216) may also thermally contact the first directional heat spreader (210). For example, the dimensions of recess (212) and/or recess (218) may be adjusted to allow for TIM material to lay between the second directional heat spreader (216) and the first directional heat spreader (210) upon recess (212) and recess (218) surfaces. In this instance, the coplanarity of the topside (201) surface of the second directional heat spreader (216) and the topside (201) surface of first directional heat spreader (210) may be substantially maintained.

Contacting the stiffening frame (220), and being in thermal contact with the first directional heat spreader (210), the second directional heat spreader (216) may transfer heat from the first directional heat spreader (210) to the opposing sidewalls (224) and base (222) of the stiffener (220) along the bivector direction (215). As described in more detail above, the second directional heat spreader (210) may also be loosely coupled to the stiffener (220) and/or the sidewalls (224).

The first directional heat spreader (210) and the second directional heat spreader (216) may be packaged together prior to thermally contacting the first directional heat spreader (210) with the semiconductor chip (202). For example, the first directional heat spreader (210) and the second directional heat spreader (216) may be packaged together (e.g., via contacting, via thermally contacting, and the like), and a thermally conductive, adhesion-promoting coating, such as Nickel plating, and the like, may be deposited upon the first directional heat spreader (210) and the second directional heat spreader (216) package.

Generally because of the increased directional coefficient of thermal conductivity, the first directional heat spreader (210) and/or the second directional heat spreader (216) may remove heat from the semiconductor chip (202) more efficiently as compared to a traditional lid and assist in the efficient heat removal from IC chip module (200) to an external heat sink by spreading heat more evenly over top sides (201) of first directional heat spreader (210) and/or second directional heat spreader (216).

The various TIMs referenced herein, may be similar or dissimilar. The TIMs generally reduces air gaps between elements, thereby increasing heat transfer there between. The TIMs may be a thermal gel, thermal compound, thermal paste, heat paste, and the like. In various embodiments, each semiconductor chip (202) of IC chip module (200) may be thermally joined to an associated cover with the same thickness of thermal interface material. In other embodiments, the various thermal interface materials may be of differing thicknesses.

IC chip module (200) may be packaged with higher level electronic device components, such as a motherboard and/or a heat sink, according to various embodiments of the present invention. The electronic device may be for example a computer, server, mobile device, tablet, and the like. The IC chip module (200) may be connected to a motherboard via interconnects. Motherboard may be the main printed circuit board of the electronic device and includes electronic components, such as a graphics processing unit, memory, and the like, and provides connectors for other peripherals. The interconnects electrically connect the carrier (206) to the motherboard and may be a wire bond, solder bond, stud, conductive ball, conductive button, and the like. The interconnects may be larger and more robust than the interconnects that connect the Semiconductor chip (202) with the carrier (206). When the IC chip module (200) is seated upon motherboard a second reflow process may be performed to join interconnects to electrical contacts of both the carrier (206) and motherboard. Alternately, a mechanical pressurized interconnect may be established.

To assist in the removal of heat from the semiconductor chip (202) a heat sink may thermally contact the IC chip module (200) via a TIM. The heat sink may be a passive heat exchanger (e.g. pin heat sink, electronic device chassis, and the like) that cools the semiconductor chip (202) by dissipating heat into the surrounding air. The heat sink may also be an active heat exchanger (i.e. forced air, forced liquid cooling system, and the like). More specifically, the heat sink may thermally contact the topside (201) surfaces of the first directional heat spreader (210) and the second directional heat spreader (216). As such, during operation of electronic device, a thermal path exists from Semiconductor chip (202) to the first directional heat spreader (210) and the second directional heat spreader (216). The thermal path may continue by transferring heat from the topsides (201) of the first directional heat spreader (210) and the second directional heat spreader (216) to the heat sink.

In alternative embodiments, an IC chip module may be configured to reduce directional stress in the orthotropic encapsulation member, in accordance with certain embodiments of the present disclosure. As described in more detail above, the use of new materials in electronic device packaging may present new difficulties. For example, graphite, as an orthotropic material, has reduced material strength in its out-of-plane dimension (e.g., dimensions orthogonal to opposing bivector direction (213)). As a result, electronic devices incorporating such materials may be shaped in such a way so as to reduce or diffuse these out-of-plane stresses.

In some embodiments, the shape of directional heat spreader may be formed in such a way so as to reduce out-of-plane stresses by tapering an end of the directional heat spreader proximal to one of the opposing sidewalls such that an area of the directional heat spreader in contact with a portion of one of the opposing sidewalls is less than an area of the directional heat spreader distal from one of the opposing sidewalls. In some configurations of the IC chip module, a directional heat spreader may be shaped such that its outer dimensions substantially conform to the shape outlined by taper lines.

By tapering the directional heat spreader, mechanical bending stress may be concentrated along the long dimension of directional heat spreader (e.g., in the same direction as bivector direction (213)). By decreasing and centering the adhered surface area of directional heat spreader to the stiffener, the associated mechanical stresses in the out-of-plane dimension (e.g., orthogonal to bivector direction (213)) may be reduced.

In the same or alternative embodiments, the shape of the directional heat spreader may be formed in such a way so as to reduce critical stresses by forming one or more hole(s) in the directional heat spreader in an area of the directional heat spreader proximal to one of the opposing sidewalls. Such holes may be formed in any appropriate manner, including drilling. Each hole may then form a container which may be filled resulting in the formation of an elastomeric column of adhesive within the directional heat spreader. In some embodiments, this column may be used as an attachment point to some portion of the stiffener. By attaching the directional heat spreader to the stiffener via an elastomeric column of adhesive, a centerline-aligned, flexible, mechanical coupling mechanism may be introduced to focus mechanical stresses along an in-plane dimension of directional heat spreader (e.g., in the same direction as bivector direction (213)).

In some embodiments, directional heat spreader may be shaped in such a way so as to reduce out-of-plane stresses both by tapering and by forming one or more hole(s) in the directional heat spreader. By incorporating both shaping mechanisms, stress reduction may be additionally reduced.

Figure 6:
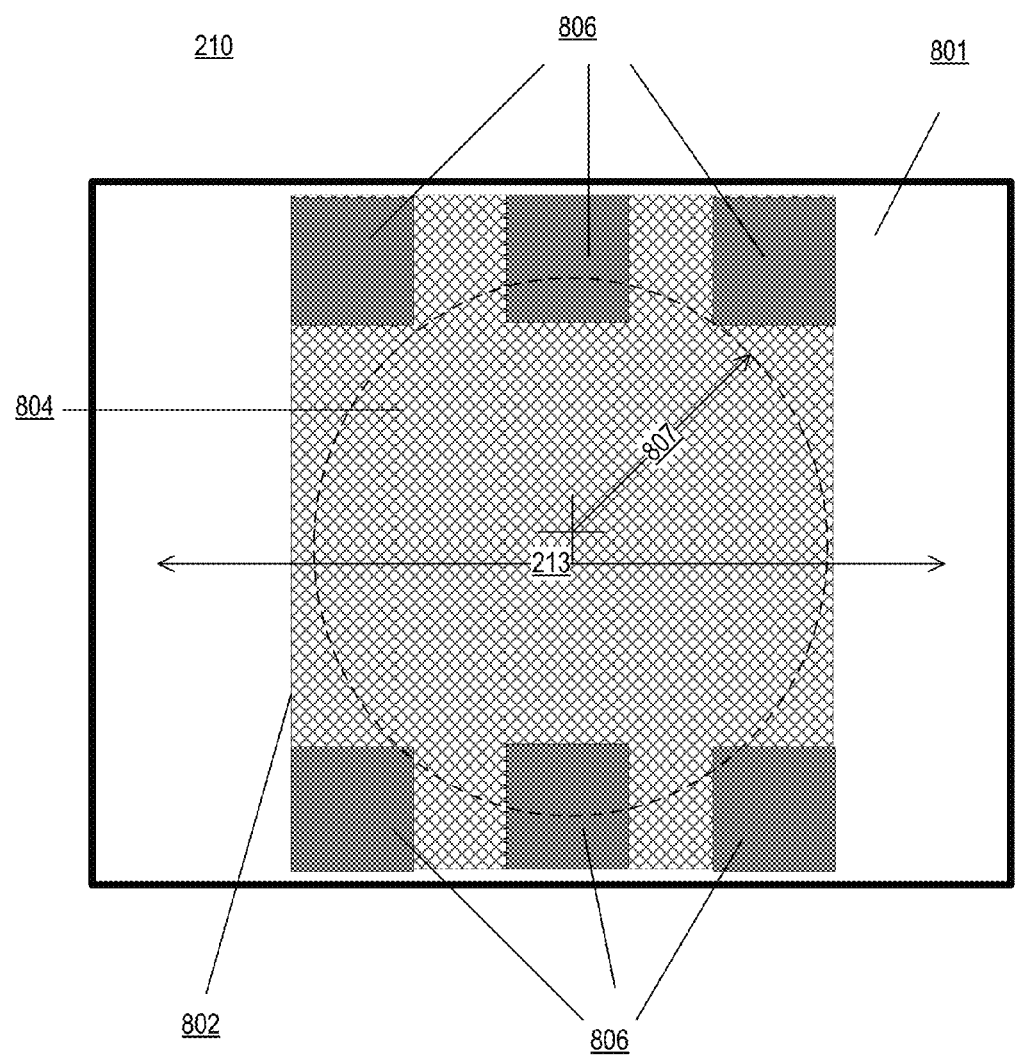
FIG. 6 illustrates an example underside of a directional heat spreader configured to reduce directional stress in the orthotropic encapsulation member, in accordance with certain embodiments of the present disclosure.

FIG. 6 illustrates an example underside of a directional heat spreader (210) configured to reduce directional stress in the orthotropic encapsulation member, in accordance with certain embodiments of the present disclosure. In some embodiments, the IC chip module (200) can include an attach structure (801) on the surface of the directional heat spreader (210) operable to increase a contact radius (807) between a center area of the directional heat spreader (210) and the semiconductor chip (202). As described in more detail above, the shape of the semiconductor chip (202) underlying the directional heat spreader (210) may form a near-point contact fulcrum over which lies the directional heat spreader (210). As a result of contact with this fulcrum, the contact radius is at a minimum and thus mechanical stresses on the directional heat spreader (210) may be concentrated and increased in the directional heat spreader (210) out-of-plane dimension.

One approach to reducing the out-of-plane stresses is to increase the effective contact area between the directional heat spreader (210) and the fulcrum portion of the semiconductor chip (202) with a structure that increases the contact radius (307). For the purposes of this disclosure, the term "contact radius" may be understood to be the distance between the concentric center of the semiconductor chip (202) and the effective contact point(s) with a bottom portion of the directional heat spreader (210) surface through a thermal interface material previously described.

In some embodiments, increasing the contact radius (807) may be accomplished by forming a groove, channel, recess, divot, or other structure in a bottom portion of the directional heat spreader (210) proximal to the semiconductor chip (202). For example, FIG. 6 illustrates an indentation (804) in a bottom portion of the directional heat spreader (210) proximal to the semiconductor chip (202). FIG. 6 illustrates an area boundary (802) generally corresponding to the portion of the directional heat spreader (210) overlying the semiconductor chip (202). In the example directional heat spreader (210), the indentation (804) has been made in directional heat spreader in order to reduce the contact between the directional heat spreader (210) and the semiconductor chip (202). In some embodiments, the indentation (804) is made into the directional heat spreader (210) at a relatively shallow depth that credits the surface curvature of the semiconductor chip (202) but does not go all the way through the directional heat spreader (210).

In the example directional heat spreader (210), the indentation (804) is made only over an area boundary (802) generally corresponding to the portion of the directional heat spreader (210) overlying the semiconductor chip (202). In alternative configurations, the indentation (804) may be a channel running the length of the directional heat spreader (210), larger than the area boundary (802) overlying the semiconductor chip (202) (e.g., to account for manufacturing ease and simplification). Additionally, the example indentation (804) is illustrated as being generally rectangular in shape to aid in understanding. However, other shapes (e.g., ovular, circular, semicircular, domed, complex combinations, etc.) would be available to one of ordinary skill in the art without departing from the present disclosure.

In some embodiments, the attach structure (801) may also include one or more protrusion(s) (806) from the side of the directional heat spreader (210) proximal to the semiconductor chip (202). Protrusions (806) may be located to simultaneously increase the contact radius (807) and preferentially contact some portion of the semiconductor chip (202) at a semiconductor chip hot spot. For the purposes of this disclosure, a "hot spot" may refer to any portion of the semiconductor chip (202) for which a designer of the semiconductor chip (202) may want to particularly alleviate a concentrated heat generation. For example, different portions of the semiconductor device (202) may generate heat at different rates and in different amounts. Therefore, in order to best alleviate local heat generation, the attach structure (801) may be shaped in such a way so as to make specific contact with those hot spots. For example, FIG. 6 illustrates a plurality of protrusions (806) (e.g., columns or pillars) extending from the directional heat spreader (210), through the indentation (804) so as to make contact with the semiconductor chip (202). By including protrusions (806), the design of the directional heat spreader (210) may be tailored to increase the contact radius (807) and address the specific heat generation mitigation needs of the particular semiconductor chip (202) with which it is associated.

Although FIG. 6 illustrates protrusions (806) as being generally rectangular, other shapes (e.g., ovular, circular, point, triangular, etc.) may be available to one of ordinary skill in the art without departing from the scope of the present disclosure. Further, although FIG. 6 illustrates protrusions (806) as being generally singular and evenly spaced, other configurations (e.g., rails, different spacing, targeted spacing, etc.) may be available to one of ordinary skill in the art without departing from the scope of the present disclosure. The attach structure (801) including recesses (804) and/or protrusions (806) on a bottom surface of the heat spreader may be formed by machining, pressing, annealing, molding, surface treatment (e.g., plating), etc. For example, the attach structure (801) may be formed by a two-step nickel plating operation.

FIG. 7 depicts a flow chart illustrating an example method (900) for reducing directional stress in an orthotropic encapsulation member (e.g., directional heat spreader (210)) of an electronic package, in accordance with certain embodiments of the present disclosure. In some embodiments, method (900) includes attaching (902) a stiffening frame (220) to a carrier (206), the stiffening frame (220) comprising a central opening (226) to accept a semiconductor chip (202), a base portion (222), and a plurality of opposing sidewalls (224). As described in more detail above with reference to FIGS. 2-8, stiffening frame (220) and carrier (206) provide the structure into which semiconductor chip (202) and directional heat spreader (210) fit, wherein directional heat spreader (210) is shaped to reduce a directional stress along the opposing bivector direction (213).

Method (900) also includes electrically coupling (904) semiconductor chip (202) to carrier (206) concentrically arranged within the central opening (226). In some embodiments, when being attached, stiffening frame (220) may be aligned with carrier (206) such that opening (226) is substantially concentric with semiconductor chip (202) or, if semiconductor chip (202) is not yet installed, with locations to which semiconductor chip (202) will be attached to carrier (206). An adhesive may be applied to the underside (199) of stiffening frame (220) or to topside (201) of carrier (206). Depending upon the type of adhesive, a curing process may be needed to cure the adhesive.

In some embodiments, semiconductor chip (202) is attached to carrier (206) by way of interconnects and underfill is applied. In certain embodiments semiconductor chip (202) is attached using a solder bump processes including a solder reflow. Underfill may be applied around a portion of the perimeter of semiconductor chip (202) and drawn thereunder by capillary action. In some embodiments, underfill may be subject to a curing process. The curing of underfill may or may not coincide with the curing of the adhesive connecting the stiffening frame (220) and the carrier (206). In some embodiments, this process may occur prior to attaching stiffening frame (220) to carrier (206).

In some embodiments, an adhesive may be applied to stiffening frame (220). For example, adhesive may be applied to base portion (222) of stiffening frame (220) and/or inner surfaces of sidewalls (224). If polymeric, the adhesive may be applied by brush, dispenser, and the like. The adhesive may also consist of a b-staged epoxy or adhesive preform and may be pre-attached to stiffener (220). In some embodiments, the directional heat spreader (210) is shaped to modify adhesion forces to reduce a directional stress along the opposing bivector direction (213). In such cases, the adhesive may be preferentially located along the heat spreader (210) centerline or form elastomeric columns within holes (716) in heat spreader (210) proximal to one or more of the opposing sidewalls (224).

Method (900) also includes thermally contacting (906) directional heat spreader (210) to semiconductor chip (202), the directional heat spreader (210) transferring heat from semiconductor chip (202) in an opposing bivector direction (213) towards opposing sidewalls (224), wherein directional heat spreader (210) is shaped to reduce a directional stress along the opposing bivector direction (213). In various embodiments, thermal interface material may be applied to semiconductor chip (202) and/or the underside of directional heat spreader (210). Directional heat spreader (210) is attached to stiffening frame (202) and thermally contacts semiconductor chip (202). In various embodiments, another thermal interface material may be applied to the topside (201) of directional heat spreader recess (212) or the underside (199) second directional heat spreader recess (218). In some embodiments, second directional heat spreader (216) may be attached to first heat spreader (210).

FIG. 8 depicts a flow chart illustrating an example method of usage (1000) of an electronic package within an electronic device, in accordance with certain embodiments of the present disclosure. In some embodiments, method (1000) includes electrically connecting (1002) an IC chip module (200) to a motherboard (706). As described in more detail above, IC chip module (200) includes: a carrier (206) comprising a top surface (702) and a bottom surface (704) configured to be electrically connected to a motherboard (706); a stiffening frame (22) attached to carrier top surface (702), stiffening frame (220) comprising a central opening (226) that accepts a semiconductor chip (202), a base portion (222), and a plurality of opposing sidewalls (224); semiconductor chip (202) electrically connected to the carrier top surface (702) and concentrically arranged within central opening (226), and directional heat spreader (210) thermally contacting semiconductor chip (202), the directional heat spreader (210) transferring heat from semiconductor chip (202) in an opposing bivector direction (213) towards opposing sidewalls (224), wherein directional heat spreader (210) is shaped to reduce a directional stress along the opposing bivector direction (213).

Example method (1000) also includes thermally contacting (1004) a heat sink (e.g., heat sink (104) to IC chip module (200). In some embodiments, a thermal interface material may be applied to IC chip module (200). For example, thermal interface material may be injected, painted, spread, placed on or otherwise applied to the topside (201) surfaces of directional heat spreader (210). The heat sink may be attached utilizing thermal interface material, thermal tape, epoxy, preform, and the like. Generally, a force may be applied to secure the heat sink to IC chip module (200). A heat transfer path exists generally between semiconductor chip (202) and the heat sink via directional heat spreader (210) (and, if present, second directional heat spreader (216)).

Certain embodiments of the present disclosure are described herein with reference to flowchart illustrations and/or block diagrams of methods, apparatus (systems), and other program products. It will be understood that each block of the flowchart illustrations and/or block diagrams, and combinations of blocks in the flowchart illustrations and/or block diagrams, can be implemented by computer readable program instructions.

It will be understood from the foregoing description that modifications and changes may be made in various embodiments without departing from its true spirit. The descriptions in this specification are for purposes of illustration only and are not to be construed in a limiting sense. The scope of the present disclosure is limited only by the language of the following claims.

What is claimed is:

1. A method of reducing directional stress in an orthotropic encapsulation member of an electronic package, the method comprising:
   attaching a stiffening frame to a carrier, the stiffening frame comprising a central opening to accept a semiconductor chip, a base portion, and a plurality of opposing sidewalls;
   electrically coupling the semiconductor chip to the carrier concentrically arranged within the central opening; and
   thermally contacting a directional heat spreader to the semiconductor chip, the directional heat spreader transferring heat from the semiconductor chip in an opposing bivector direction towards opposing sidewalls, wherein the directional heat spreader is shaped to reduce a directional stress along the opposing bivector direction by forming:
   a hole in the directional heat spreader in an area of the directional heat spreader proximal to one of a plurality of opposing stiffener sidewalls;
   an elastomeric column adhering the stiffening frame to the directional heat spreader within the hole in the directional heat spreader.

2. The method of claim 1, wherein the directional heat spreader is shaped to reduce the directional stress by tapering an end of the directional heat spreader proximal to one of the plurality of opposing stiffener sidewalls such that an area of the directional heat spreader in contact with a portion of the stiffening frame is less than an area of the directional heat spreader distal from the one of the opposing sidewalls.

3. The method of claim 1, wherein the directional heat spreader is loosely mechanically coupled to the electronic package such than an area of the directional heat spreader adhered to the electronic package proximal to an opposing sidewall of the stiffening frame is less than an area of the directional heat spreader distal from the opposing sidewall of the stiffening frame.

4. The method of claim 1, wherein the directional heat spreader is shaped to reduce the directional stress by forming on a side of the directional heat spreader proximal to the semiconductor chip an attach structure operable to increase a contact radius between a center area of the directional heat spreader and the semiconductor chip.

5. The method of claim 4, wherein the attach structure comprises an indentation on the side of the directional heat spreader proximal to the semiconductor chip, the indentation of a shape to increase and decentralize contact area between the directional heat spreader and the semiconductor chip.

6. The method of claim 5, wherein the attach structure comprises a local protrusion within the indentation from the side of the directional heat spreader proximal to the semiconductor chip, the protrusion located to contact the semiconductor chip at a semiconductor chip hot spot.

7. An integrated circuit chip module comprising:
   a carrier comprising a top surface and a bottom surface configured to be electrically connected to a motherboard;
   a stiffening frame attached to the carrier top surface, the stiffening frame comprising a central opening that accepts a semiconductor chip, a base portion, and a plurality of opposing sidewalls;

a semiconductor chip electrically connected to the carrier top surface and concentrically arranged within the central opening; and a directional heat spreader thermally contacting the semiconductor chip, the directional heat spreader transferring heat from the semiconductor chip in an opposing bivector direction towards opposing sidewalls, wherein the directional heat spreader is shaped to reduce a directional stress along the opposing bivector direction by forming:

a hole in the directional heat spreader in an area of the directional heat spreader proximal to one of a plurality of opposing stiffener sidewalls;

an elastomeric column adhering the stiffening frame to the directional heat spreader within the hole in the directional heat spreader.

8. The integrated circuit chip module of claim 7, wherein the directional heat spreader is shaped to reduce the directional stress by tapering an end of the directional heat spreader proximal to one of a plurality of opposing stiffener sidewalls such that an area of the directional heat spreader in contact with a portion of the stiffening frame is less than an area of the directional heat spreader distal from the one of the opposing sidewalls.

9. The integrated circuit chip module of claim 7, wherein the directional heat spreader is loosely mechanically coupled to the electronic package such than an area of the directional heat spreader adhered to the electronic package proximal to an opposing sidewall of the stiffening frame is less than an area of the directional heat spreader distal from the opposing sidewall of the stiffening frame.

10. The integrated circuit chip module of claim 7, wherein the directional heat spreader is shaped to reduce the directional stress by forming on a side of the directional heat spreader proximal to the semiconductor chip an attach structure operable to increase a contact radius between a center area of the directional heat spreader and the semiconductor chip.

11. The integrated circuit chip module of claim 10, wherein the attach structure comprises an indentation on the side of the directional heat spreader proximal to the semiconductor chip, the indentation of a shape to increase and decentralize contact area between the directional heat spreader and the semiconductor chip.

12. The integrated circuit chip module of claim 10, wherein the attach structure comprises a local protrusion within the indentation from the side of the directional heat spreader proximal to the semiconductor chip, the protrusion located to contact the semiconductor chip at a semiconductor chip hot spot.

13. A method of reducing directional stress in an orthotropic encapsulation member of an electronic package, the method comprising:

electrically connecting a IC chip module to a motherboard, the IC chip module comprising:

a carrier comprising a top surface and a bottom surface configured to be electrically connected to a motherboard;

a stiffening frame attached to the carrier top surface, the stiffening frame comprising a central opening that accepts a semiconductor chip, a base portion, and a plurality of opposing sidewalls;

a semiconductor chip electrically connected to the carrier top surface and concentrically arranged within the central opening; and a directional heat spreader thermally contacting the semiconductor chip, the directional heat spreader transferring heat from the semiconductor chip in an opposing bivector direction towards opposing sidewalls, wherein the directional heat spreader is shaped to reduce a directional stress along the opposing bivector direction by forming:

a hole in the directional heat spreader in an area of the directional heat spreader proximal to one of a plurality of opposing stiffener sidewalls;

an elastomeric column adhering the stiffening frame to the directional heat spreader within the hole in the directional heat spreader;

thermally contacting a heat sink to the IC chip module.

14. The method of claim 13, wherein the directional heat spreader is shaped to reduce the directional stress by tapering an end of the directional heat spreader proximal to one of a plurality of opposing stiffener sidewalls such that an area of the directional heat spreader in contact with a portion of the stiffening frame is less than an area of the directional heat spreader distal from the one of the opposing sidewalls.

15. The method of claim 13, wherein the directional heat spreader is shaped to reduce the directional stress by forming on a side of the directional heat spreader proximal to the semiconductor chip an attach structure operable to increase a contact radius between a center area of the directional heat spreader and the semiconductor chip.

* * * * *